United States Patent [19]

Cibulka et al.

[11] 4,139,788

[45] Feb. 13, 1979

[54] TEST CIRCUIT FOR INDICATION OF DEVIATION OF SOURCE VOLTAGES FROM THEIR SET POINTS

[75] Inventors: Josef Cibulka, Prague; Jaroslav Hloušek, Prague; Richard Jelínek, Prague; Jan Krtek, Karlovy Vary; Jiří Winkler, Prague, all of Czechoslovakia

[73] Assignee: CKD Praha, oborovy podnik, Prague, Czechoslovakia

[21] Appl. No.: 809,431

[22] Filed: Jun. 23, 1977

[30] Foreign Application Priority Data

Jun. 23, 1976 [CS] Czechoslovakia .................. 4140/76

[51] Int. Cl.² ............................................. H03K 5/18
[52] U.S. Cl. .................................. 307/350; 307/355; 328/146
[58] Field of Search ............... 307/314, 350, 354, 355, 307/357, 363; 328/146–148

[56] References Cited

U.S. PATENT DOCUMENTS 3,742,251  6/1973  Thompson et al. ............. 307/357 X Primary Examiner—John Zazworsky

[57] ABSTRACT

A test circuit for determining when one of a number of source voltages deviates from its set point. Each source voltage has coordinated comparison circuit which compares the voltage with a preset value, and which has a limited range of output voltage. Each comparison circuit has its output connected to a switching circuit. The output of each switching circuit is connected to a short circuit coil of one coupling transformer. The coupling transformer is fed from an auxiliary current source through an auxiliary coil and has as output a pick-up coil connected to an evaluation device.

2 Claims, 3 Drawing Figures

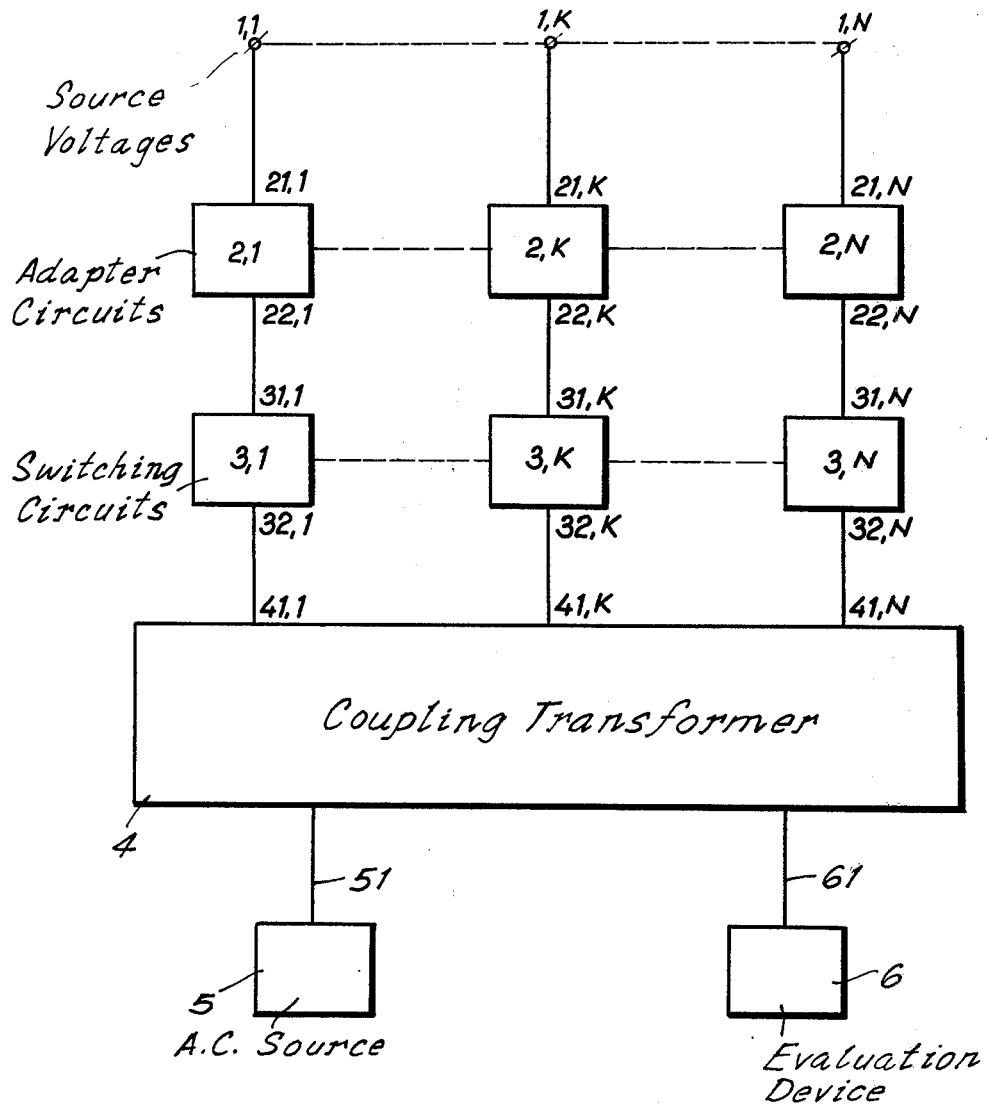

TEST CIRCUIT FOR INDICATION OF DEVIATION OF SOURCE VOLTAGES FROM THEIR SET POINTS

BACKGROUND OF THE INVENTION

The invention relates to a test circuit for comparing source voltages with preselected set points or set ranges and for determination of the presence of deviations between set value and actual value.

A number of applications within the power electronic technology require control circuits wherein the information, whether in a group of rectifiers either none or at least one is passing electric current, or also if either none or at least one is in a conducting state, is ascertained. A system such as a cycloconverter may comprise a full series of groups of rectifying diodes requiring the collection of information as to their electrical state. Generally the desired information is collected via test circuits providing such information in a variety of ways. The main criteria as to suitability of such test circuits include reliability, thermal stability, and, especially when a larger number of test circuits is required, a system which is inexpensive and simple.

Furthermore, it is frequently desirable to determine if each of a number of source voltages is equal to a set voltage or a set range of voltages in each of a variety of components. A reliable information about the current in a switching element and information whether the current amounts to a certain value is obtainable by determining if the voltage drop produced by the element is smaller or larger than the largest possible voltage drop caused by the operating current in a switched-on situation. Procedures of the prior art for determining the voltage drop of a rectifying diode lead, especially for groups of rectifying diodes, to complex arrangements in obtaining the dual information about the presence or absence of a voltage drop, e.g., by applying a rectifier, a series resistance or a Schmitt circuit with its own voltage source at the level of the voltage to be determined.

Informations obtained in this manner about all the voltages to be traced have to be transferred to the voltage level of the control circuits and then a corresponding logical operation has to be performed with them.

A reliable indicator for the presence or absence of current in a thyristor relies on the presence or absence of voltage between gate and cathode. Test circuits based on the input of this voltage are generally very complicated. In particular for a larger number of thyristors this voltage generally switches a transistor circuit with its own current source and the information is transferred to the potential level of the control circuit or a transistor switch is switched with this voltage enabling the passage of an alternating current signal between the coils of two transformers. At least one independent transformer is needed for each thyristor of the group to be controlled.

SUMMARY OF THE INVENTION

It is an object of the invention to provide a test circuit and to connect each source voltage to be tested to an adapter circuit.

It is another object of the invention to provide a test circuit having a switch connection for each adapter circuit.

It is another object of the invention to provide a coupling transformer having input coils which can be short circuited by the outputs of the switch connections, an auxiliary input coil for an auxiliary alternating current source and an output coil connected to an evaluation circuit.

It is another object of the invention to provide a test circuit which can be composed of conventional elements, which has a large input resistance, which is very fast in reacting to voltage changes, which covers a wide range, and which is insensitive to changes in temperature.

It is another object of the invention to overcome the disadvantages of the prior art requiring a complicated test circuit for finding deviations from set points.

It is another object of the invention to trace a group of voltages on different potential levels and to determine if either none or at least one of the voltages has changed beyond its set point, and if this occurred from above or below.

It is another object of this invention to provide a test and control circuit for a group of voltages employing a simple circuit with a single joint coupling transformer.

Thus the present invention covers a test and control circuit for the determination of zero electrical current for a plurality N of source elements. The test and control circuit comprises N adapter circuits, each having its input connected to the corresponding source element and each having an output; the test and control circuit comprises N connecting circuits each having an input connected to the output of the corresponding adapter circuit, whereby the adapter circuit matches the test elements to the input of each connecting circuit, and each having an output; and a coupling transformer having N short circuit input coils with each coil being connected to the output of one corresponding connecting circuit. Preferably the test and control circuit also comprises an auxiliary current source connected to an auxiliary short circuit input coil and an evaluation device connected to a pick-up coil of the transformer. The test circuit of the present invention determines deviations in voltage for N source voltages and comprises N comparison circuits each having its input connected to the corresponding source voltage and each having an output; N switching circuits each having an input connected to the output of the corresponding comparison circuit whereby each comparison circuit compares the corresponding source voltage to an internal setting and produces an output for the corresponding switching circuit, and each switching circuit having an output; and a coupling transformer having N short circuit input coils and each such coil being connected to the output of one of the corresponding switching circuits. This test circuit is preferably operated in conjunction with an auxiliary signal source connected to an auxiliary input of the transformer and with an evaluation circuit connected to a pick-up coil of the transformer.

The invention accordingly consists in the features of construction, combination of elements, and arrangement of parts which will be exemplified in the circuit hereinafter described and of which the scope of application will be indicated in the appended claims.

BRIEF DESCRIPTION OF THE DRAWING

In the accompanying drawing in which are shown several of the various embodiments of the invention:

FIG. 1 is a block diagram of the circuits of the invention;

DETAILED DESCRIPTION OF THE PREFERRED EMBODIMENTS

Figure 2:
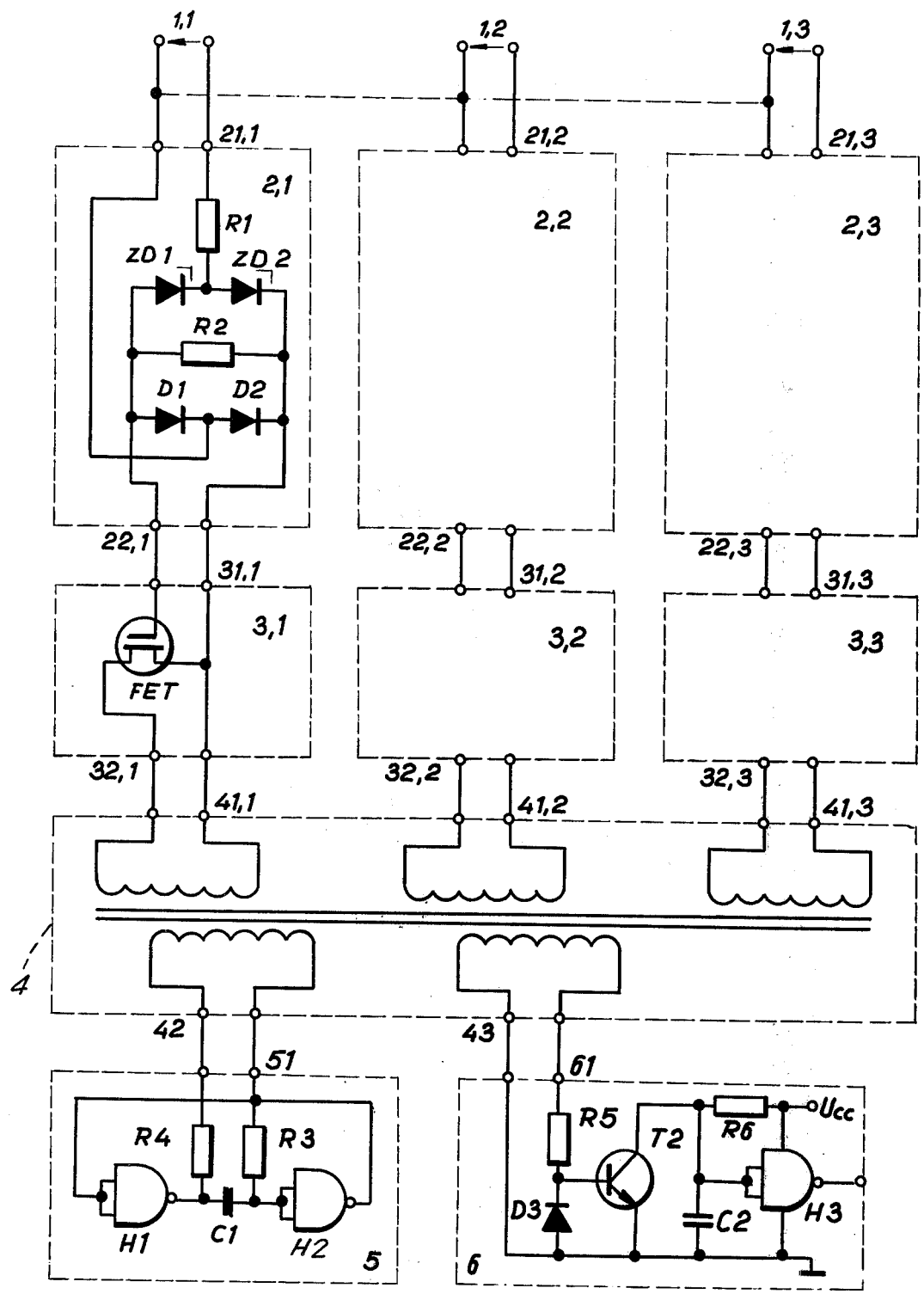
FIG. 2 is a diagram of an example with a particular circuit for the blocks.

Referring now to FIG. 1, each source voltage 1,1 to 1,N is connected to the input 21,1 to 21,N of adapter circuits 2,1 to 2,N and the outputs 22,1 to 22,N of the adapter circuits 2,1 to 2,N are connected to the inputs 31,1 to 31,N of connecting or switching circuits 3,1 to 3,N and its outputs 32,1 to 32,N are connected to the short circuit input coils 41,1 to 41,N of a coupling transformer 4. N is a whole number. The input 51 of the coupling transformer 4 is connected to an auxiliary alternating current or signal source 5. The pick-up or output 61 of the coupling transformer 4 is connected to an evaluation device 6.

The voltage being monitored 1,N is regulated with the adapter circuit 2,N and adapted for the input of the switching circuit 3,N which in the presence of a control signal at its input 31,N changes the impedance seen at its output 32,N. The adapter circuit 2,N can be a comparison circuit which compares the source voltage 1,N with a voltage internally set in this circuit or externally provided to it.

If it is desirable to determine if either all of the monitored voltages are larger or at least one is smaller than the set voltage, as occurs with the testing of voltage drops of rectifying diodes then it is advantageous to have the impedance of the switching device increase after introduction of the control signal. In this situation it is advantageous to employ in the connecting circuit 3,N, etc. certain types of field effect transistors (FET) as shown in FIG. 2. For determining if either all traced voltages are smaller or at least one is larger than the set voltage, e.g., for testing the voltage between gate and cathode of a thyristor or npnp-device, it is advantageous to have a decreasing impedance between the output connections 32,N of the connecting device 3,N after introduction of the control signal, as disclosed in FIG. 3. At least one short circuit coil 41,N of the coupling transformer having been short circuited by the decreased impedance of a connecting device 3,N, this can be evaluated as a decrease of the impedance of another coil of the coupling transformer 4. E.g., this can be realized by connecting the contacts of the input coil 42 of the coupling transformer 4 to the auxiliary alternating current source 5. The automatic evaluating device 6 connected to the output coil 43 of the coupling transformer 4 can determine whether the voltage fed into the input contact is larger or not than the set voltage, which corresponds to short circuiting of either none or at least one of the short circuit coils 41,N.

It is advantageous to use a single transformer for all traced voltages. A low power transformer can be used, especially when employing an auxiliary alternating current source with a high frequency. The specific embodiment is unimportant for the basic functioning, e.g., the transformer can employ a circular, toroidal or bar core made from laminated iron or ferrite. Applying a circular core results in the advantage of having a close coupling between the short circuit coils 41 and the auxiliary input coils 42 and applying a core in the form of a bar results in the advantage of having the short circuit coils 41 placed between the auxiliary input coil 42 and the output coil 43. The time delay is predominantly determined by the frequency of the auxiliary alternating current source and by the delay introduced through the evaluation device.

FIG. 2 shows a simple embodiment for the monitoring of three voltage drops along rectifying diodes. The monitored voltage 1,1 is rectified in the adapter circuit by a bridge comprising diodes D1 and D2 and Zener diodes ZD1 and ZD2, whereby the voltage is limited by means of the Zener diodes. The resistor R1 serves as a series resistance and resistor R2 serves as a discharge resistance of the input capacity of the field effect transistor FET of circuit 3,1. The sensitivity of the testing circuit can be influenced by the relative values of the resistors R1 and R2. In this case the connecting device or switching circuit 3,1 comprises a MOS-FET of the depletion type, which opens at zero gate voltage and which closes by a gate voltage of one polarity. In this embodiment, the coupling transformer 4 is fitted with five coils. When the monitored voltages are connected in a voltage mode then the particular short circuit coils 41 can only be isolated for a small voltage limited by the Zener diodes ZD1 and ZD2. Two positive NAND gates H1 and H2, a resistor R3 and a condensor C1 form the auxiliary alternating current source 5. The internal impedance of the auxiliary current source is determined by resistor R4. Transistor T2, resistor R5, diode D3, condensor C2, and positive NAND gate H3 form the evaluation stage.

If the absolute value of at least one of the monitored voltages is lower than a predetermined one so as not to suffice for decoupling the respective transistor FET 3 via adapter circuit 2, said FET transistor short-circuits a short circuit winding 41 connected thereto. Consequently, a magnetic flux generated in the core of the coupling transformer 4 by the auxiliary AC source 5 via auxiliary input coil 32 will have a low level so that a voltage to be induced in the pick-up coil 43 has also a low level so that no connection of the transistor T2 occurs. The H3 gate input assumes then the binary number ONE level.

On the other hand, if the absolute values of all the monitored voltages exceed a predetermined one so that all the FET transistors in the switching circuits are decoupled, the voltage induced in the pick-up coil 43 suffices for connecting the transistor T2 once per one period via resistor R5 whereby the H3 gate input shows the binary number ZERO value and the discharge of the capacitor C2 occurs. The H3 gate output will show then the binary number ONE.

After decoupling the transistor T2, the filter capacitor C2 is capable to keep the H3 gate input within the voltage range of binary number ZERO for a time given by the quantity of capacity of the capacitor C2 whereby a part of the auxiliary AC signal period is overbridged from the negative voltage source 5. When the control voltage of a random FET-transistor falls below a certain value, this reduces its resistance and in turn the voltage induced at the output coil 43 to such an extent that transistor T2 cannot switch any longer. The output of gate H3 is then permanently on the level of logical zero.

Figure 3:
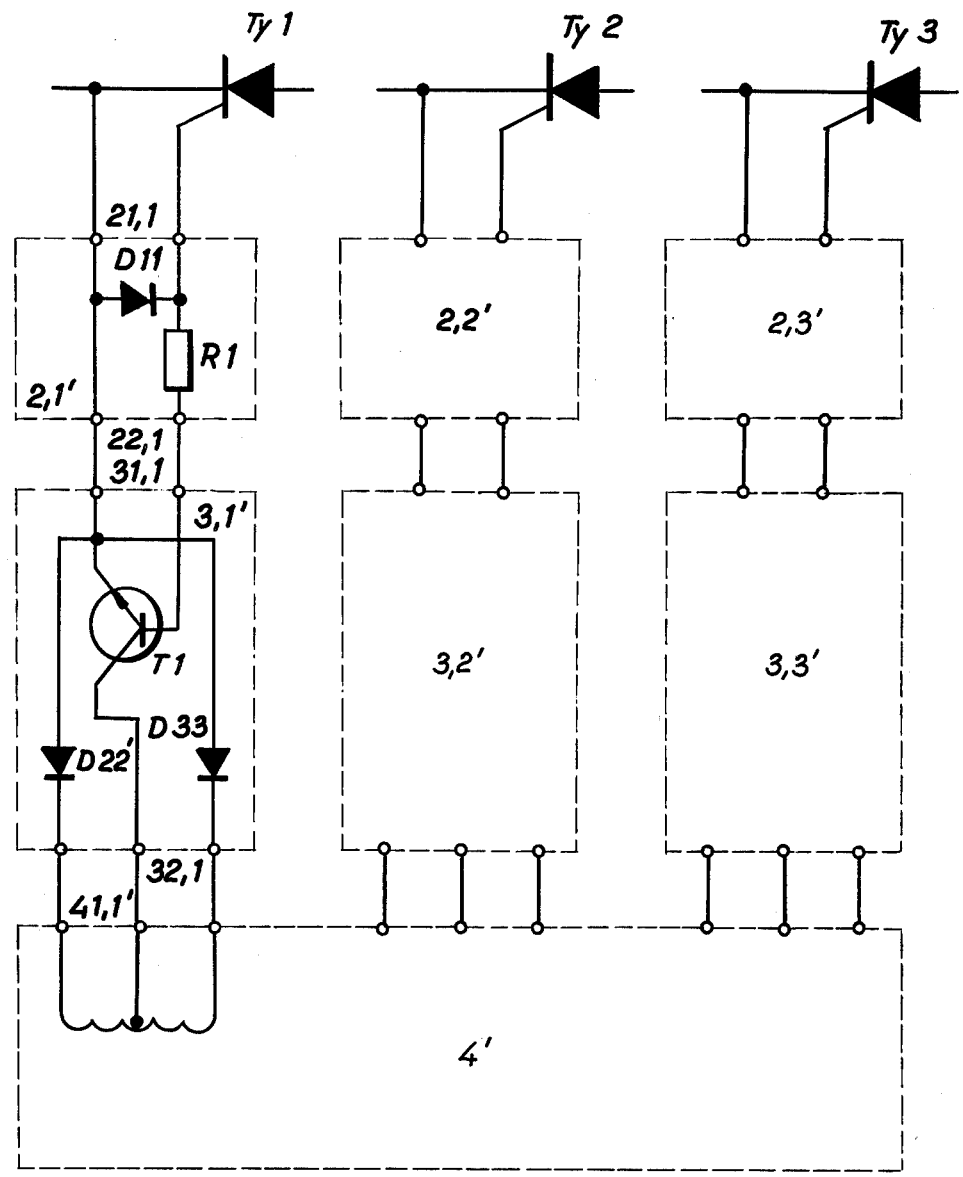
FIG. 3 is a diagram of an additional modification of a particular circuit for the blocks.

FIG. 3 shows a simple embodiment of the adapter circuit 2', the connecting device 3' and the short circuit input coil 41' of the coupling transformer 4' for a testing circuit constructed for voltage testing between gate and cathode of a thyristor.

If one of the thyristors TY1, TY2, TY3 is coupled, an anode or plate current flowing therethrough causes a certain voltage to be generated between the controlling electrode and the cathode, which voltage is sufficient to couple the transistor T 1 via resistor R 1. The transistor T 1 in cooperation with the diodes D22' and D33 will then short-circuit the short circuit coil 41. This can be evaluated in a fashion analogous to that shown in FIG. 2 by employing an auxiliary current source 5 and an evaluation circuit 6. Several transistors or an integrated circuit can be used in the connecting circuit 3' for increased sensitivity of the system.

The circuits of the invention are not limited to a zero current tester but can be employed advantageously where information is desired relating to the voltages of a group of devices and if at least one of the voltages deviates from a set point, either upward or downward, and when fast response times, large input resistances and simple circuitry are desired. Such a test circuit can, e.g., be employed to check if there is a contact between a wire and a machine resulting in an accidental short circuit.

Although the invention is illustrated and described with reference to a plurality of preferred embodiments, it is to be expressly understood that it is in no way limited to the disclosure of such a plurality of embodiments, but is capable of numerous modifications within the scope of the appended claims.

What is claimed is:

1. A test circuit for determination of zero electrical current for a plurality of N source elements, comprising
    N adapter circuits each having its input connected to the corresponding source element and each having one output for producing an output current in response to a deviation from the zero electrical current condition in that source element;
    N connecting circuits each having an input connected to the output of the corresponding adapter circuit, so as to change the impedance of the output of the connecting circuit in response to the output current of the corresponding adapter circuit;
    a coupling transformer;
    N short circuit coils in the transformer, each coil being connected to the output of one corresponding connecting circuit;
    an auxiliary signal source;
    an auxiliary input coil in the transformer connected to the auxiliary signal source;
    an evaluation circuit; and
    a pick-up coil in the transformer connected to the evaluation circuit.

2. A test circuit for determination of deviations in voltage for N source voltages, comprising
    N comparison circuits each having its input connected to the corresponding source voltage and each having an output;
    N switching circuits each having an input connected to the output of the corresponding comparison circuit, whereby each comparison circuit compares the corresponding source voltage to its internal setting and produces an output for the corresponding switching circuit, and each switching circuit having an output;
    a coupling transformer having N input short circuit coils and each coil being connected to the output of a corresponding switching circuit; p1 an auxiliary current source connected to an auxiliary input of the transformer; and
    a pick-up coil in the transformer connected to an evaluation device.

* * * * *